(12) United States Patent
Al-Amoody et al.

(10) Patent No.: US 10,312,150 B1
(45) Date of Patent: Jun. 4, 2019

(54) PROTECTED TRENCH ISOLATION FOR FIN-TYPE FIELD-EFFECT TRANSISTORS

(71) Applicant: GLOBALFOUNDRIES Inc., Grand Cayman (KY)

(72) Inventors: Fuad Al-Amoody, Rexford, NY (US); Jinping Liu, Ballston Lake, NY (US); Joseph Kassim, Albany, NY (US); Bharat Krishnan, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/919,594

(22) Filed: Mar. 13, 2018

(51) Int. Cl.
| | |
|---|---|
| *H01L 21/8234* | (2006.01) |
| *H01L 21/311* | (2006.01) |
| *H01L 21/033* | (2006.01) |
| *H01L 21/02* | (2006.01) |
| *H01L 21/308* | (2006.01) |

(Continued)

(52) U.S. Cl.
CPC .. *H01L 21/823481* (2013.01); *H01L 21/0206* (2013.01); *H01L 21/0217* (2013.01); *H01L 21/02178* (2013.01); *H01L 21/02186* (2013.01); *H01L 21/0332* (2013.01); *H01L 21/0337* (2013.01); *H01L 21/3081* (2013.01); *H01L 21/31111* (2013.01); *H01L 21/31116* (2013.01); *H01L 21/31144* (2013.01); *H01L 21/475* (2013.01); *H01L 21/823431* (2013.01); *H01L 21/823437* (2013.01); *H01L 29/66795* (2013.01); *H01L 29/785* (2013.01); *H01L 21/0228* (2013.01); *H01L 21/02164* (2013.01); *H01L 21/02271* (2013.01); *H01L 21/76224* (2013.01); *H01L 21/823418* (2013.01); *H01L 29/0649* (2013.01); *H01L 29/66545* (2013.01)

(58) Field of Classification Search
CPC ........... H01L 21/0217; H01L 21/02178; H01L 21/02186; H01L 21/02263; H01L 21/02266; H01L 21/02269; H01L 21/02271; H01L 21/30604; H01L 21/308; H01L 21/3081; H01L 21/31144; H01L 21/467; H01L 21/475; H01L 21/47573; H01L 21/823431; H01L 21/823821; H01L 27/0886; H01L 27/0924; H01L 29/66795; H01L 29/785; H01L 29/7851
See application file for complete search history.

(56) References Cited

U.S. PATENT DOCUMENTS

| | | | |
|---|---|---|---|
| 8,697,536 B1 | 4/2014 | Cheng et al. | |
| 8,815,702 B2 * | 8/2014 | Oh | H01L 21/84 |
| | | | 257/E21.442 |

(Continued)

*Primary Examiner* — Stephen W Smoot
(74) *Attorney, Agent, or Firm* — Thompson Hine LLP; Francois Pagette

(57) ABSTRACT

Methods of forming a fin-type field-effect transistor. A gate structure is formed that extends across a plurality of semiconductor fins. A spacer layer composed of a dielectric material is conformally deposited over the gate structure, the semiconductor fins, and a dielectric layer in gaps between the semiconductor fins. A protective layer is conformally deposited over the spacer layer. The protective layer over the dielectric layer in the gaps between the semiconductor fins is masked, and the protective layer is then removed from the gate structure and the semiconductor fins selective to the dielectric material of the spacer layer.

20 Claims, 4 Drawing Sheets

(51) Int. Cl.
    *H01L 29/78*     (2006.01)
    *H01L 21/475*     (2006.01)
    *H01L 29/66*     (2006.01)
    *H01L 29/06*     (2006.01)
    *H01L 21/762*     (2006.01)

(56) References Cited

U.S. PATENT DOCUMENTS

| | | | |
|---|---|---|---|
| 9,171,752 B1* | 10/2015 | Wu | H01L 21/76224 |
| 9,349,837 B2* | 5/2016 | Ching | H01L 29/66795 |
| 2008/0265321 A1* | 10/2008 | Yu | H01L 21/26586 |
| | | | 257/344 |
| 2014/0273429 A1* | 9/2014 | Wei | H01L 29/401 |
| | | | 438/595 |
| 2016/0064379 A1* | 3/2016 | Yu | H01L 21/0223 |
| | | | 257/192 |
| 2017/0117274 A1* | 4/2017 | Cai | H01L 21/823418 |
| 2017/0352663 A1* | 12/2017 | Zhou | H01L 21/0332 |

* cited by examiner

PROTECTED TRENCH ISOLATION FOR FIN-TYPE FIELD-EFFECT TRANSISTORS

BACKGROUND

The present invention relates to semiconductor device fabrication and integrated circuits and, more specifically, to methods of forming a fin-type field-effect transistor.

Device structures for a field-effect transistor generally include a body region, a source and a drain defined in the body region, and a gate electrode configured to switch carrier flow in a channel formed during operation in the body region. When a control voltage exceeding a designated threshold voltage is applied to the gate electrode, carrier flow occurs in the channel between the source and drain to produce a device output current. For a planar field-effect transistor, the body region and channel are located beneath the top surface of a substrate on which the gate electrode is supported.

A fin-type field-effect transistor (FinFET) is a non-planar device structure that may be more densely packed in an integrated circuit than planar field-effect transistors. A Fin-FET may include one or more fins composed of semiconductor material, heavily-doped source/drain regions, and a gate electrode that wraps about a channel located in the fin body between the source/drain regions. The arrangement between the gate electrode and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

The fins of a FinFET are partially buried in an isolation layer of dielectric material that is applied after the fins are formed and before the source/drain regions are formed by epitaxial growth. The clean and etch processes associated with the formation of the source/drain regions may recess the isolation layer and introduce gouges and voids in the isolation layer, which introduces holes in the body region. The gouges and voids in the isolation layer and the holes in the body region may subsequently become filled by a conductor, which can cause electrical shorts between adjacent gate electrodes or between a gate electrode and an adjacent interconnect contact extending to a source/drain region.

SUMMARY

In an embodiment, a method includes forming a gate structure extending across a plurality of semiconductor fins, depositing a spacer layer composed of a dielectric material conformally over the gate structure, the semiconductor fins, and a dielectric layer in gaps between the semiconductor fins, and depositing a protective layer over the spacer layer. The method further includes masking the protective layer over the dielectric layer in the gaps between the semiconductor fins. After masking the protective layer over the dielectric layer in the gaps between the semiconductor fins, the protective layer is removed from the gate structure and the semiconductor fins selective to the dielectric material of the spacer layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1B is a top view of the device structure in which FIG. 1 is taken generally along line 1-1 and FIG. 1A is taken generally along line 1A-1A.

DETAILED DESCRIPTION

Figure 1:
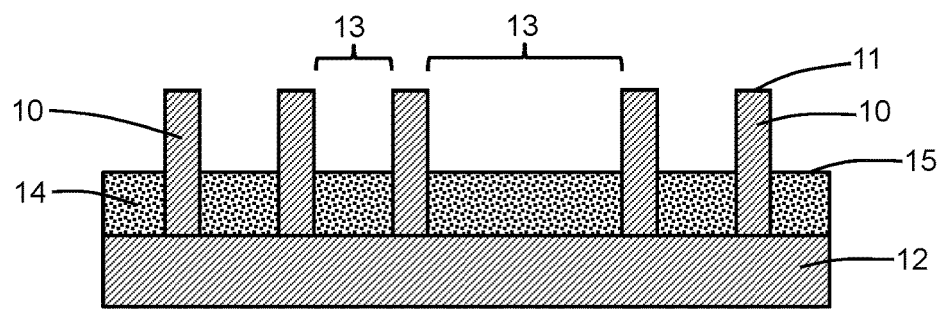
FIG. 1 is a cross-sectional view of a device structure at an initial fabrication stage of a processing method in accordance with embodiments of the invention.
Figure 1A:
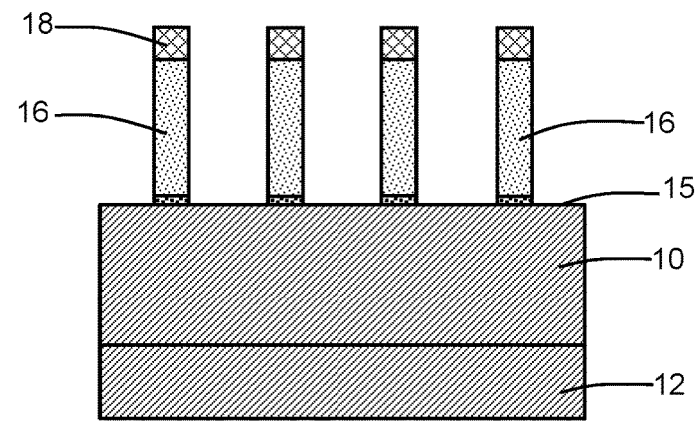
FIG. 1A is a cross-sectional view of the device structure of FIG. 1.

With reference to FIG. 1 and in accordance with embodiments of the invention, semiconductor fins 10 are arranged on a substrate 12. The semiconductor fins 10, which contain a single crystal semiconductor material such as single crystal silicon, may be patterned from the semiconductor material of the substrate 12 or an epitaxial layer formed on the substrate 12 using lithography and etching processes, such as a sidewall imaging transfer (SIT) process, self-aligned double patterning (SADP), or self-aligned quadruple patterning (SAQP). The semiconductor fins 10 may be formed with a given pitch such that adjacent semiconductor fins 10 are separated by gaps 13, and have a top surface 11.

A dielectric layer 14 is arranged to surround and bury lower sections of the semiconductor fins 10, and upper sections of the semiconductor fins 10 are exposed above a top surface 15 of the dielectric layer 14. In an embodiment, the dielectric layer 14 may be composed of a dielectric material, such as silicon dioxide ($SiO_2$), deposited by chemical vapor deposition (CVD), and may provide electrical isolation. The dielectric layer 14 may be recessed, subsequent to deposition, with an etching process to expose the upper sections of the semiconductor fins 10. The upper sections of the semiconductor fins 10 extend from the top surface 15 of the dielectric layer 14 to the top surface 11 of each semiconductor fin 10.

Gate structures 16 are arranged to extend across the semiconductor fins 10 and the top surface 15 of the dielectric layer 14. The gate structures 16, which are lengthwise oriented transverse to the lengths of the semiconductor fins 10 and which may have been cut into segments, overlap with respective channel regions in the semiconductor fins 10 at spaced-apart locations. The gate structures 16 may include a dummy gate composed of a polycrystalline semiconductor material, such as polysilicon, and may include a thin dielectric layer arranged between the dummy gate and the exterior surfaces of the semiconductor fins 10. The gate structures 16 may be formed by depositing the materials of the dummy gate and thin dielectric layer over the semiconductor fins 10 and the dielectric layer 14, and patterning the materials with an etching process.

A cap 18 is arranged on the top surface of each gate structure 16 and may be a remnant of their patterning. The caps 18 may be composed of a dielectric material, such as silicon nitride ($Si_3N_4$), deposited by chemical vapor deposition (CVD).

Figure 2:
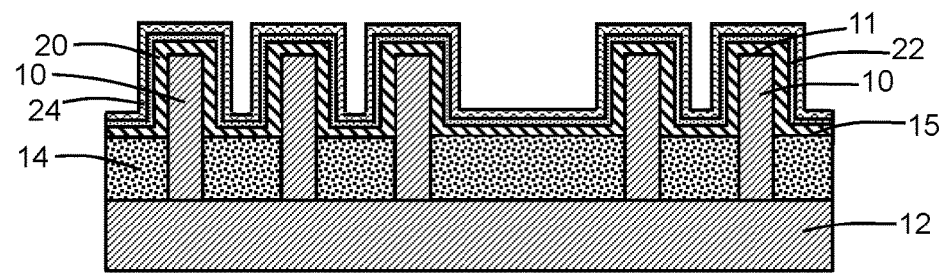
FIGS. 2 and 2A are cross-sectional views at a fabrication stage subsequent to FIGS. 1 and 1A.
Figure 1B:
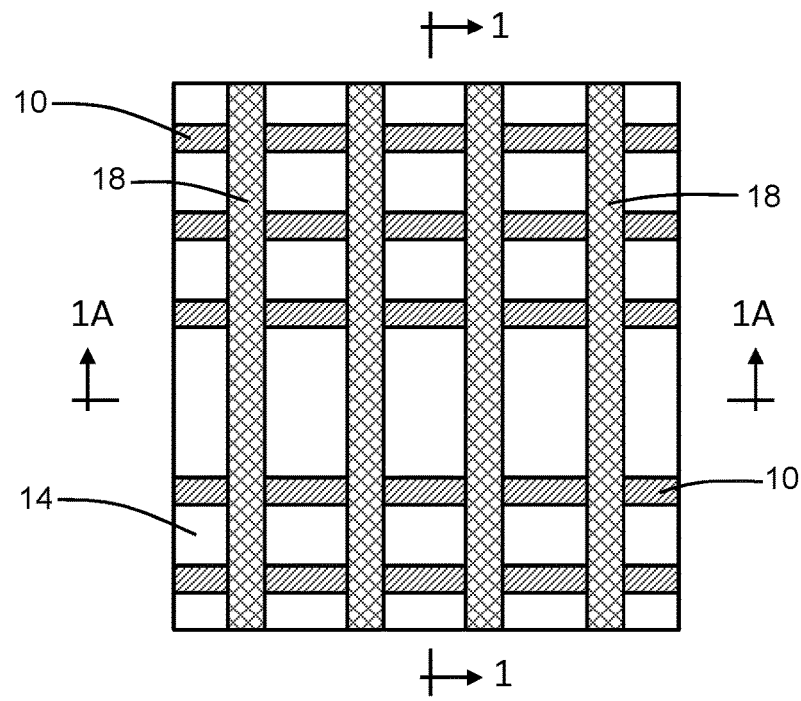
Figure 2A:
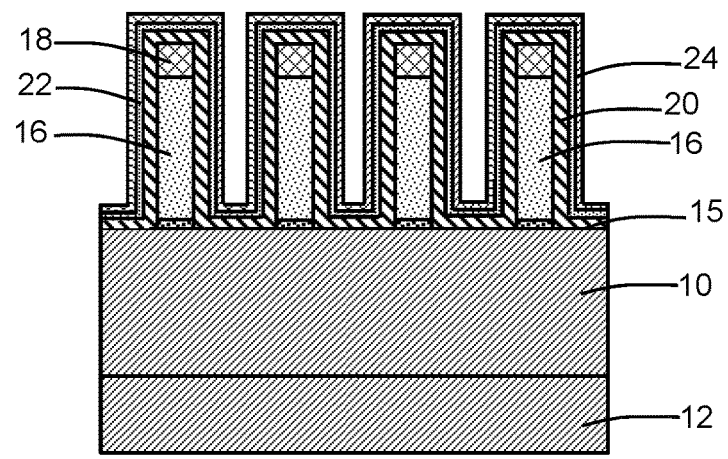

With reference to FIG. 2 in which like reference numerals refer to like features in FIG. 1 and at a subsequent fabrication stage, a conformal layer 20 is formed over the semiconductor fins 10, the dielectric layer 14, and the gate structures 16, and adopts their topology. The conformal layer 20 may be composed of a dielectric material, such as a low-k dielectric material like SiOCN. The conformal layer 20 may be deposited by, for example, atomic layer deposition (ALD), and may have a nominally equal thickness at all locations.

A conformal layer 22 is formed over conformal layer 20, and adopts the topology of the semiconductor fins 10, the dielectric layer 14, and the gate structures 16. The conformal layer 22 may be composed of a dielectric material, such as silicon dioxide ($SiO_2$). The conformal layer 22 may be deposited by, for example, atomic layer deposition (ALD), and may have a nominally equal thickness at all locations. The dielectric material of the conformal layer 22 may be chosen to be etched selectively to the dielectric material of the conformal layer 20. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The conformal layers 20 and 22 are subsequently used in the process flow to form spacers.

A conformal layer 24 is formed over conformal layer 22, and also adopts the topology of the semiconductor fins 10, the dielectric layer 14, and the gate structures 16. The conformal layer 24, which acts as a protective layer for the conformal layers 20, 22, may be composed of a dielectric material, such as aluminum dioxide ($Al_2O_3$). In alternative embodiments, the conformal layer 24 may be composed of a nitride of silicon (e.g., $Si_3N_4$), or titanium oxide ($TiO_x$). In an embodiment, the conformal layer 24 may be composed of a material that is removable selective to silicon dioxide. The conformal layer 24 may be deposited by, for example, atomic layer deposition (ALD), and may have a nominally equal thickness at all locations. In alternative embodiments, the conformal layer 24 may be deposited by chemical vapor deposition (CVD) or physical vapor deposition (PVD). The dielectric material of the conformal layer 24 may be chosen to be etched selectively to the dielectric material of the conformal layer 22 and to the dielectric material of the dielectric layer 14. The conformal layer 24 may be in direct contact with the conformal layer 22.

The total thicknesses of the conformal layers 20, 22, 24 are selective such that the gaps 13 between adjacent semiconductor fins 10 are not closed. The conformal layer 24, which is used to protect the dielectric layer 14 against erosion and gouging in subsequent processes associated with epitaxial source/drain growth, is applied after the gate structures 16 are formed. Forming such a protection layer before the gate structures are formed, as is conventional, may degrade the effectiveness of that protection layer during the subsequent epitaxial source/drain growth from exposure to the intervening processes.

Figure 3:
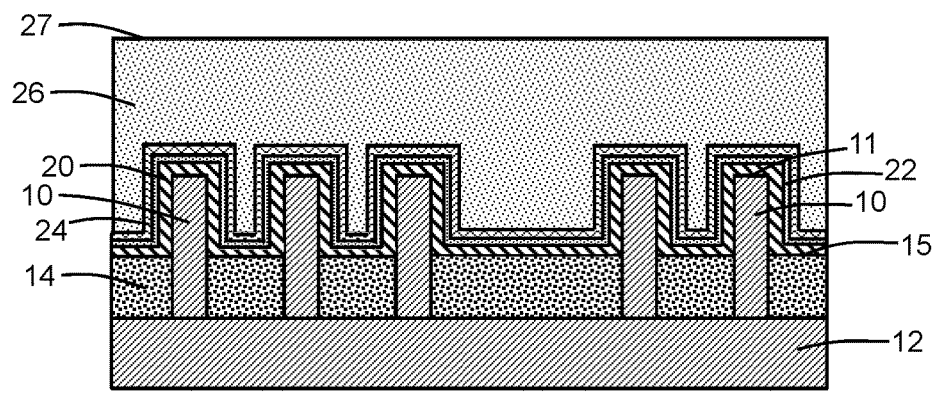
FIGS. 3-6 are cross-sectional views of the device structure at fabrication stages subsequent to FIG. 2.

With reference to FIG. 3 in which like reference numerals refer to like features in FIG. 2 and at a subsequent fabrication stage, a hardmask layer 26, which may be a spin-on hardmask (SOH) such as an organic planarization layer (OPL) or any other easily removable carbon-containing film such as an amorphous carbon layer (ACL), is applied over the semiconductor fins 10, the dielectric layer 14, the gate structures 16, and the conformal layers 20, 22, 24 thereon. The hardmask layer 26 may be applied by spin coating, and may be considered to be a planarizing layer formed over the semiconductor fins 10, the dielectric layer 14, and the gate structures 16 as covered by the intervening conformal layers 20, 22, 24. The thickness of the hardmask layer 26 may be chosen to be greater than the height of the gate structures 16 such that a top surface 27 of the hardmask layer 26 is arranged above the top surface 11 of the semiconductor fins 10 and such that the semiconductor fins 10, the dielectric layer 14, the gate structures 16, and the conformal layers 20, 22, 24 are buried within the hardmask layer 26.

Figure 4:
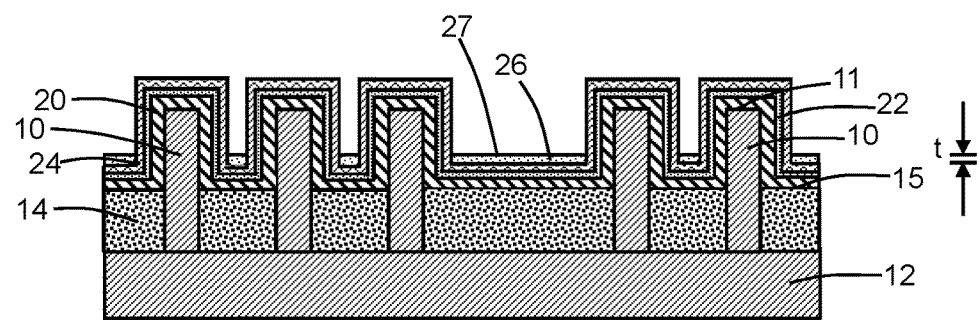

With reference to FIG. 4 in which like reference numerals refer to like features in FIG. 3 and at a subsequent fabrication stage, the hardmask layer 26 is recessed with an etching process. More specifically, the top surface 27 of the hardmask layer 26 is recessed to an extent that exposes the conformal layer 24 on the semiconductor fins 10 and the gate structures 16, but that covers the stack of conformal layers 20, 22, 24 on the dielectric layer 14 in the gaps 13 between the semiconductor fins 10. The top surface 27 of the recessed hardmask layer 26 is arranged in a vertical direction between the top surface 11 of the semiconductor fins 10 and the top surface 15 of the dielectric layer 14. The thickness of the recessed hardmask layer 26 is less than the height of the semiconductor fins 10 measured relative to the top surface 15 of the dielectric layer 14 and is less than the height of the gate structures 16 also measured relative to the top surface 15 of the dielectric layer 14. The deposited thickness of the hardmask layer 26 may be greater than 100 nanometers (nm), and the recessed thickness of the hardmask layer 26 may be less than or equal to 10 nm.

Figure 5:
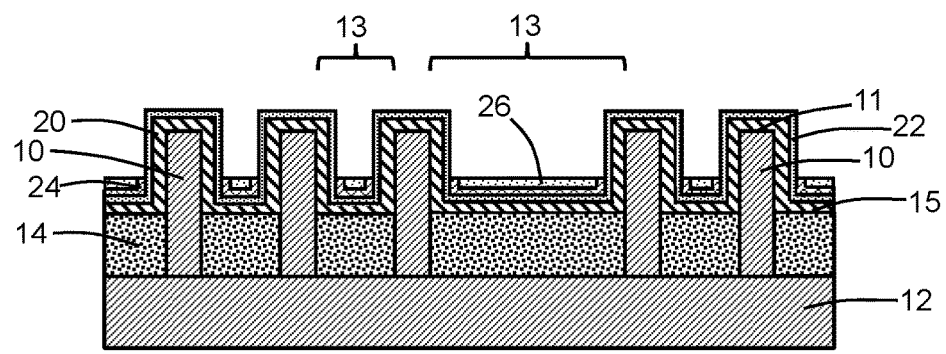

With reference to FIG. 5 in which like reference numerals refer to like features in FIG. 4 and at a subsequent fabrication stage, the conformal layer 24 is selectively removed and thereby patterned by a wet clean or wet chemical etch relative to the conformal layer 22. The recessed hardmask layer 26 operates as an etch mask during the selective removal such that sections of the conformal layer 24 remain over the dielectric layer 14 in the gaps 13 between the semiconductor fins 10 and cover its top surface 15 with sections that operate as a protective layer. The conformal layer 24 is removed from all areas, such as the gate structures 16 and the semiconductor fins 10, over which its protective function is not required. The conformal layer 22 is exposed on the semiconductor fins 10 and the gate structures 16 after the conformal layer 24 is patterned.

Figure 6:
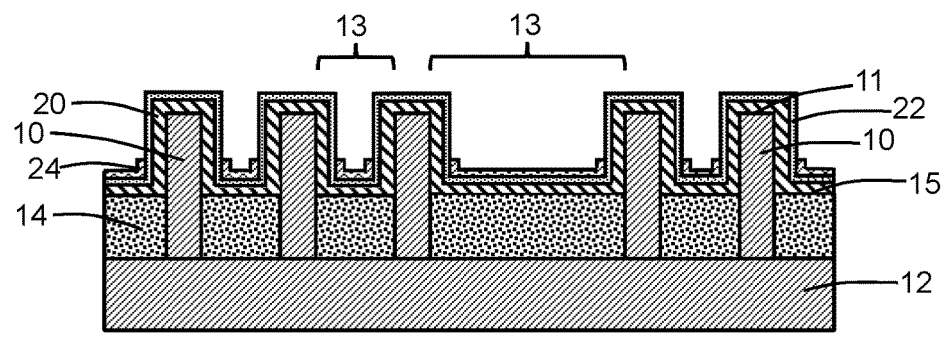

With reference to FIG. 6 in which like reference numerals refer to like features in FIG. 5 and at a subsequent fabrication stage, the remnant sections of the recessed hardmask layer 26 are removed after the conformal layer 24 is patterned. The residual sections of the conformal layer 24 in the gaps 13 between the semiconductor fins 10 and over the top surface 15 of the dielectric layer 14 are exposed after the hardmask layer 26 is removed. The chamfering approach, which relies on the recessed hardmask layer 26 to pattern the conformal layer 24, leaves the conformal layer 24 over the dielectric layer 14 between the semiconductor fins 10, while completely removing the conformal layer 24 from other locations over which the protection afforded by the conformal layer 24 is not needed.

Processing continues with the formation of epitaxial semiconductor source/drain regions of a field-effect transistor in the gaps 13 between the semiconductor fins 10, which entails the formation of another spin-on hardmask and a series of process steps involving wet cleans (e.g., dilute hydrofluoric acid) and reactive ion etches to prepare the top surface 11 of the semiconductor fins 10 in the gaps 13 for the epitaxial growth of the source/drain regions. The conformal layer 24 protects the top surface 11 of the semiconductor fins 10 in the gaps 13 during some of these wet claims and reactive ion etches, before being remove prior to the epitaxial growth. A replacement gate process may also follow that entails removal of the gate structures 16 and replacement with a high-k gate dielectric and a metal gate electrode to provide the field-effect transistor with functional gate structures. Middle-of-line (MOL) processing and back-end-of-line (BEOL) processing follow, which includes formation of contacts, via plugs, and wiring of an interconnect structure connected with the field-effect transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a gate structure extending across a plurality of semiconductor fins;
   depositing a spacer layer composed of a dielectric material conformally over the gate structure, the semiconductor fins, and a dielectric layer in gaps between the semiconductor fins;
   depositing a protective layer conformally over the spacer layer;
   masking the protective layer over the dielectric layer in the gaps between the semiconductor fins; and
   after masking the protective layer over the dielectric layer in the gaps between the semiconductor fins, removing the protective layer from the gate structure and the semiconductor fins selective to the dielectric material of the spacer layer.

2. The method of claim 1 wherein masking the protective layer over the dielectric layer in the gaps between the semiconductor fins comprises:
   forming a hardmask layer over the protective layer on the gate structure, the semiconductor fins, and the dielectric layer in the gaps between the semiconductor fins.

3. The method of claim 2 wherein the hardmask layer has a planar top surface when formed, and further comprising:
   recessing the planar top surface of the hardmask layer relative to the gate structure and the semiconductor fins.

4. The method of claim 3 wherein the planar top surface of the hardmask layer, after recessing, is arranged in a vertical direction between a top surface of the semiconductor fins and a top surface of the dielectric layer.

5. The method of claim 3 wherein, after recessing, the hardmask layer has a thickness of less than or equal to 10 nanometers.

6. The method of claim 2 wherein the hardmask layer is a spin-on hardmask.

7. The method of claim 2 wherein the hardmask layer is a carbon-containing film.

8. The method of claim 2 further comprising:
   after removing the protective layer from the gate structure and the semiconductor fins, removing the hardmask layer from the protective layer over the dielectric layer arranged in the gaps between the semiconductor fins.

9. The method of claim 1 wherein the protective layer is composed of aluminum dioxide.

10. The method of claim 1 wherein the protective layer is composed of a nitride of silicon or titanium oxide.

11. The method of claim 1 wherein the protective layer is selectively removed relative to the spacer layer by a wet clean or a wet chemical etch.

12. The method of claim 1 wherein the protective layer over the dielectric layer in the gaps between the semiconductor fins is retained after removing the protective layer from the gate structure and the semiconductor fins.

13. The method of claim 1 wherein the dielectric layer has a top surface that is planar, each of the semiconductor fins has a first section arranged above the top surface of the dielectric layer and a second section arranged below the top surface of the dielectric layer, and the spacer layer is arranged over the first section of each of the semiconductor fins.

14. The method of claim 1 wherein the protective layer is composed of a material that is removable selective to silicon dioxide.

15. The method of claim 1 wherein the protective layer is deposited after the gate structure is formed.

16. The method of claim 1 further comprising:
   after removing the protective layer from the gate structure and the semiconductor fins, performing a wet clean or a reactive ion etch with the protective layer over the dielectric layer in the gaps between the semiconductor fins.

17. The method of claim 1 wherein the protective layer is deposited over the spacer layer by chemical vapor deposition or physical vapor deposition.

18. The method of claim 1 wherein the spacer layer is arranged between the protective layer and a top surface of the dielectric layer in the gaps between the semiconductor fins.

19. The method of claim 18 wherein the protective layer is in direct contact with the spacer layer.

20. The method of claim 1 wherein the gate structure is cut before the protective layer is formed.

* * * * *